United States Patent Office 3,359,145

Patented Dec. 19, 1967

3,359,145

ELECTRICALLY CONDUCTING ADHESIVE

Ival O. Salyer and James L. Schwendeman, Dayton, and Bobby R. Hickman, Bellbrook, Ohio, assignors to Monsanto Research Corporation, St. Louis, Mo., a corporation of Delaware No Drawing. Filed Dec. 28, 1964, Ser. No. 421,656
12 Claims. (Cl. 156—1)

ABSTRACT OF THE DISCLOSURE

A process whereby an adhesive bonding two or more conductors is made electrically conducting by adding to it ferromagnetic particles and hardening the mixture in a magnetic field so as to form a bridge of conducting particles between the bonded surfaces.

This invention relates to bonding of electricity conducting materials and more particularly provides a new and valuable method of joining such materials by use of organic adhesives to give well-bonded units having very good electricity conducting properties.

The bonding of electricity conducting materials, e.g., copper wiring, thermoelectric elements, and elements of electrical devices, generally, has usually involved the use of metal-containing solders rather than of organic adhesives. Although there are available many solders which permit joining two electricity conducting elements without impeding flow of electrical current at the bond, the use of organic adhesives for this purpose is usually disadvantageous because the resinous components of organic, self-drying adhesives generally posses the property of impeding, rather than conducting, the flow of an electrical current. They are insulators, rather than conductors. Hence, although numerous synthetic polymeric materials are tenacious bonding agents for the electricity-conducting metals, their use with such metals is generally limited to applications which do not involve conducting of an electrical current. Since use of solders often requires temperatures which may be impracticable, especially when manipulation of delicate apparatus is involved, much research has been directed at the provision of electricity-conducting organic adhesives. Such research has resulted in products wherein fillers having electrical properties are incorporated into a self-hardening, organic adhesive, e.g., electricity conducting materials such as the carbon blacks or copper or silver or other noble metals are mixed with the non-conducting organic adhesive in an attempt to facilitate the flow of electrical current through the bonding layer. However, only limited success has been thereby attained. Any decrease in resistivity of the bonding layer is generally at the expense of bonding strength, i.e., to obtain good conductivity the electricity-conducting filler must be used in such high proportions, with respect to the organic adhesive, that either inadequate adhesion and/or a weak bonding layer results.

An object of the present invention is to join together two units, each possessing electricity conducting property, to form an integral unit possessing substantially the electricity conducting property of the two units. Another object is the uniting of two electrical conductors with an organic adhesive to obtain a unit having electricity conducting property. Still another object is the provision of a method of joining together electricity conducting units by means of an organic adhesive to form a tenacious bond of low electrical resistivity. A further object is to increase the electrical conductivity of known electricity conducting adhesives. A very important objective is the provision of electricity conducting fillers which are magnetizable.

These and other objects hereinafter defined are provided by the invention wherein electricity conducting units are joined together by interposing between the units at the desired junction so as to contact a surface of each unit, a layer of a composition consisting essentially of (1) a hardenable organic adhesive in the mobile state and (2) from 5% to 60% by weight of the composition of a ferromagnetic, electricity conducting, finely particulated filler; and maintaining one interface of the layer normal to the lines of force of a magnetic field while the adhesive is hardening, to orient particles of the filler toward the opposite interface.

According to the invention there is employed with the organic adhesive a filler which possesses not only the property of conducting an electrical current but which is also susceptible to magnetic force, and while the adhesive is hardening, the particles of filler are oriented to form an electricity conducting bridge between the units which are being bonded. Thereby, electrical current is not dissipated by randomly directed conductive particles. When the adhesive composition is applied, it is mobile; hence, the magnetizable particles contained therein are able to respond to magnetic force. A magnetic force directed normal to one interface of the adhesive layer aligns the filler particles across the thickness of the layer and maintains the particles in that direction until the layer has hardened. When the adhesive has become hard, the particles are rigidized in such a position that they virtually form a bridge between the adherends. They then serve as electrical connectors between the two electricity conducting units. In the case of butt joints, the particles of the filler are aligned in the direction of the electrical paths of the conducting units which have been joined. In lap joints the particles are aligned to provide for electrical contact between the two units by bridges which are perpendicular to the electrical path of the two units. In both butt and lap joints the conducting magnetic particles are aligned across the thickness dimension of the adhesive layer to provide particulate conducting paths from one electrode to the other.

By the term "hardenable organic adhesive in the mobile state" is meant any organic composition having adhesive properties which is mobile before it is applied to the adherend and hardens or becomes rigid after being applied. Hardening may be brought about merely by standing at ambient temperature, or by changing the temperature. When a mobile organic adhesive hardens merely as a result of standing, it is generally owing to the presence in the composition of constituents which react with each other to form hard, polymeric materials. An example of this is the epoxy type of adhesive, which immediately prior to use is a viscous mix of the reaction product of epichlorohydrin, and a diphenol such as bisphenol A, and an amine catalyst or curing agent, which mix hardens to a rigid product upon standing at room or elevated temperatures. Another example is provided by the polyurethane type of adhesive wherein the constituents, e.g. a diisocyanate or a partially polymerized diisocyanate, a polyol and an amine, are mixed together just before use to give a viscous composition which hardens upon standing with or without heating, depending upon the nature of the constituents. The organic adhesive in the mobile state may also be of a thermosetting type; e.g., a partial condensation product which changes, under the influence of heat, from a viscous, mobile state to a permanently hard, infusible material. Phenolic resins of the Novolak type in admixture with a hardening agent such as hexamethylenetetramine are examples thereof. The adhesive may also be of a thermoplastic type, e.g., vinyl polymers and polyamides which soften upon heating and harden upon cooling. Also useful for the present purpose are the lacquer, paste or emulsion types of adhesives which have been formulated from a resinous binding agent and a volatilizable solvent; as the solvent volatilizes, the adhesive hardens. The polyvinyl resins, e.g., polyvinyl butyral or vinyl chloride/vinyl acetate copolymer or the polysilicones, e.g., phenyldimethyl- and phenyl (methyl) polysiloxanes, are examples of useful resinous binding agents. Many other examples of organic adhesives that harden by standing or by change in temperature and/or pressure are given in the books, "The Technology of Adhesives," by John Delmonte, Reinhold Publishing Co., N.Y., 1947; "Concise Guide to Structural Adhesives" by Werner H. Guttmann, Reinhold Publishing Co., N.Y., 1961; "Science of Adhesive Joints" by J. J. Bikerman, Academic Press, N.Y., 1961; and "Adhesive Raw Materials Handbook" by E. P. McGuire, Padric Publishing Co., Mountainside, N.J., 1964. The incorporation of electricity-conducting materials into organic adhesives is also well known, see, e.g., U. S. Patent No. 2,444,034 to N. H. Collings wherein finely divided noble metals are used with a resin, and Japan 4958 (58) to S. Mizuno (Chemical Abstracts (1958) page 21230), wherein glass fibers coated with silver are used with a phenolic resin.

The filler which is admixed with the adhesive while it is in a mobile state should be capable of conducting electricity and be susceptible to magnetism. Although metals, generally, are electricity conductors, only a comparatively few are magnetizable, e.g., iron, cobalt, nickel, gadolinium and many alloys thereof. Metals of the iron group are generally useful; however, a disadvantage of some of these metals for some filler applications is that they are readily oxidizable. Since the oxides generally do not conduct electricity, the electrical property of the filler—which is, of course, the main function—suffers when the filler is exposed to the atmosphere. Even though imbedded in the hardened adhesive, oxidation is a problem whenever the surface of the exposed portion of the adhesive bond contains particles of the filler that are not thoroughly coated by the organic adhesive. Oxidation is thus a problem of much potential significance because attack of the filler lessens bond strength; accordingly, when there is a possibility that the bonded objects will be subject to corrosion-inducing conditions, the filler should be a material which is impervious to oxygen and/or water.

According to this invention, such a filler is provided by coating the surfaces of finely particulated metal or iron fibers or wires of the iron group with an electrically-conducting metal which is more resistant to oxidation than the ferromagnetic material. The surface coating prevents oxidation of the magnetic core. Examples of useful metals with which particles of metals of the iron group are coated include the noble metals and such other metals and alloys as copper, aluminum, zinc, chromium, bronze, tin, titanium, tungsten, bismuth, magnesium, antimony, etc. The surface coating may be applied in any manner known to be effective for applying a metal surface to a substrate, e.g., by electroplating, by deposition from a colloidal solution, by volatilization, or by decomposition of a metal-yielding complex, e.g., a complex of the desired surface-coating metal with a diketone such as acetylacetone. Commercially available solutions for use in depositing a coating of a metal upon substrate are generally useful for this purpose. In operation, the particles may be simply immersed in the commercial solution, e.g., Atomex® (Engelhard Industries), moderate heat may be applied, and the mixture may be stirred in order to keep the particles in suspension and thus facilitate even deposition of the metal coating on the entire surface of each particle. Generally a continuous, adherent coating of the metal is obtained within a few minutes.

The particles of filler may vary greatly in size or shape; i.e., there may be used very fine sphere-like particles or dusts, coarsely ground metals, metal filings or chips, or comminuted wires or other elongated particles. The latter form is advantageously employed because it results in better electrical bridging between the conducting units which are being bonded. Advantageously the length of the elongated filler is equal to, or slightly exceeds, bond thickness. Optimum bridging is thereby obtained. Generally, the filler is present in a concentration which will be from 5% to 60% by weight of the composition, the ratio of filler to adhesive being dependent upon the nature of the adhesive and of the filler. Although polymer systems employed in the formulation of adhesives generally can tolerate an amount of filler which can be equal to or greater than the weight of the other component or components, we have found that for optimum orientation of particles, and hence for optimum electrical conductivity, it is advantageous to maintain the quantity of filler at or below about 60% by weight of the total adhesive composition. At higher concentrations, there is less space available for easy movement of the filler particles, so that the orientation which facilitates flow of electrical current through the bond of adhesive becomes increasingly difficult. At very low concentrations, i.e., at concentrations of less than about 5% by weight of the total composition, the quantity of filler, even though well oriented, is insufficient to bring about the desired decrease in the resistivity of the organic adhesive, although some decrease is obtained so long as any filler having electricity conducting properties is present. The mobility of the particle, and consequent orientation, is also determined by the size and shape of the particle. A spherical particle requires less space in which to turn than does a long, needle-like particle; hence, it should follow that the better results would be obtained with spherical particles. However, continuity of electrical path is a factor in providing for improved conductivity, and such continuity is better attained by using a filler having length, rather than by superpositioning of spheres. Hence, even though fewer needle-like particles can be oriented in a given volume, the results obtained with comparatively low concentrations of the long particles are substantially the same as those obtained with higher concentrations of spherical particles. The optimum concentration of filler thus depends upon the shape of the particles. Particle size is also a factor which must be considered. When the same magnetic force is applied, a large particle is not so readily oriented as a small one.

Although concentration, shape and size all have an effect in arriving at optimum electrical conductivity so that the lowest possible resistivity is exhibited by the adhesive bond, variation of these factors to determine the most suitable is a matter of routine experimentation to those skilled in the art. Within the 5% to 60% concentration range, decreased resistivity results by application of magnetic force to an adhesive composition containing a filler which possesses both ferromagnetic and electricity conducting properties. The concentration at which minimal resistivity is demonstrated will be within the more narrow range of, say, from 10% to 50% of filler by weight of the total composition.

The nature of the organic adhesive is relatively immaterial insofar as attainment of decreased resistivity is employed, so long as the adhesive is in the mobile state. Rigidity does not permit free movement of the filler; similarly variation in degree of mobility of the organic adhesive affects the extent to which the filler particles are oriented by a constant magnetic force. The more mobile the adhesive, the less force is required to impel the particles in the desired reaction. However, relating the viscosity of the adhesive to the required force presents no problem to those skilled in the art, since thickening impedes the orientation whereas thinning facilitates it; or, conversely, more magnetic force is required for the less mobile adhesive than for the thinly viscous adhesive to attain the same degree of orientation of the filler particles.

The invention is further illustrated by, but not limited to, the following examples.

*Example 1*

The following fillers were prepared: (A) Iron filings, passing through a 40-mesh screen were gold-plated using Atomex® immersion gold solution (Engelhard Industries) which is a clear solution of a gold complex that decomposes to deposit gold on numerous metals, including iron, cobalt, nickel, etc., and contains an equivalent of ½ oz. troy per 200 cc. of solution. It was diluted by adding 200 cc. of the solution to one gallon of water to give a bath having a pH of 7–8. After warming to 60° C., the iron filings were added to the bath and vigorously stirred therein until a continuous coating of gold had deposited on the surface of the filings. Only a few minutes were required to attain a satisfactory coating, and during this time the temperature was maintained at 60° C. The coated filings were filtered off and air-dried. (B) Iron wire, having a diameter of 0.009" was cut into 1/16" to ⅛" lengths and gold-plated as above, using the Atomex® solution.

The fillers were used in the following polyurethane-forming mixes:

(I)

| | Parts by weight |
|---|---|
| Adiprene L–100 | 7.5 |
| P–400 | 0.6 |
| MOCA | 0.5 |
| Filler (A) | [1] 2.15 |

(II)

| | |
|---|---|
| Adiprene L–100 | 7.5 |
| P–400 | 0.6 |
| MOCA | 0.5 |
| Filler (A) | [2] 3.7 |

(III)

| | |
|---|---|
| Adiprene L–100 | 5.0 |
| P–400 | 0.4 |
| MOCA | 0.33 |
| Filler (B) | [2] 2.47 |

[1] 20% of total.
[2] 30% of total.

Adiprene L–100 is a commercially available (Du Pont de Nemours and Co.) diisocyanate terminated prepolymer for use in fabrication of polyurethanes by reaction with a glycol. P–400 is a polypropylene glycol having an average molecular weight of 400. MOCA is 4,4'-methylenebis(2-chloroaniline), a hardening agent. Each formulation was thoroughly mixed.

Substrate for the mixes thus obtained were brass discs having a diameter of 1¼". To one surface of each disc a copper wire had been soldered to serve as lead in measuring electrical resistivity.

Substantially equal quantities by weight of each of the mixes were respectively troweled onto the wire-free surface of the discs. After leveling to a smooth, even layer, a disc of the same size was placed on the layer of the mix with the wire-free surface down, to form a three-tier assembly. Curing was conducted for 18 hours at 60° C. in either the presence or absence of a magnetic field. The magnetic field was provided by a 4000 gauss permanent magnet, with the assembly being positioned so that the face of the disc was normal to the lines of force. Well-bonded pieces were obtained in the presence or absence of a magnetic field, but the resistivity of the pieces was very different depending upon whether or not a magnetic field was used. This is evident from the following results:

| Mix No. | Resistivity, ohm-cm., of pieces cured in— | |
|---|---|---|
| | No magnetic field | In magnetic field |
| (I) Filings, 20% | 233 | 0.251 |
| (II) Filings, 30% | 60.4 | 0.146 |
| (III) Wire, 30% | ∞ | 0.125 |

The above data show that irrespective of particle size, curing in a magnetic field results in a pronounced decrease in resistivity. At comparable concentrations (30%) use of wire pieces in lengths that can bridge the distance between the two discs decreases resistivity from infinitely high to only 0.125 ohm-cm.

*Example 2*

The following fillers were prepared: (A) Iron wire, 0.003" in diameter was cut into 1/16–⅛" lengths and gold plated as in Example 1. (B) Iron wire, 0.009" in diameter was cut and gold plated as in Example 1.

The above fillers were incorporated into the following poylurethane-forming mixes:

(I)

| | Parts by weight |
|---|---|
| Adiprene L–100 | 5.0 |
| P–400 | 0.4 |
| MOCA | 0.33 |
| Filler (A) | [1] 2.47 |

(II)

| | |
|---|---|
| Adiprene L–100 | 5.0 |
| P–400 | 0.4 |
| MOCA | 0.33 |
| Filler (A) | [2] 1.30 |

(III)

| | |
|---|---|
| Adiprene L–100 | 7.5 |
| P–200 | 0.6 |
| MOCA | 0.5 |
| Filler (A) | [3] 0.95 |

(IV)

| | |
|---|---|
| Adiprene L–100 | 5.0 |
| P–400 | 0.4 |
| MOCA | 0.33 |
| Filler (B) | [4] 5.73 |

(V)

| | |
|---|---|
| Adiprene L–100 | 7.5 |
| P–400 | 0.6 |
| MOCA | 0.5 |
| Filler (B) | [5] 1.52 |

[1] 30% of total.
[2] 18.5% of total.
[3] 10% of total.
[4] 50% of total.
[5] 15% of total.

Adiprene L–100, MOCA and P–400 are described in Example 1. Testing of the above formulations was conducted as described in Example 1, i.e., a substantially equal quantity by weight of each formulations was respectively employed between two discs to give a 3-tier assembly. Curing was conducted at 60° C. for 18 hours, with the discs placed perpendicular to the lines of force of a 4000 gauss permanent magnet. The resulting, well-bonded pieces were found to have the following resistivities:

| Mix No. | Cured in magnetic field resistivity, ohm-cm. |
|---|---|
| (I) Wire, 0.003", 30% | 0.294 |
| (II) Wire, 0.003", 18.5% | 0.084 |
| (III) Wire, 0.003", 10% | 0.165 |
| (IV) Wire, 0.009", 50% | 0.205 |
| Ex. 1, (III), Wire, 0.009", 30% | 0.125 |
| (V) Wire, 0.009", 15% | 0.334 |

For purposes of comparison, the data of Example 1 for formulation III of that example are included in the above table, as noted. The data show that concentration of the filler, as well as particle size affects resistivity when curing is conducted in the magnetic field. The results are believed to be related to the extent of the orientation which can be caused by the magnetic force. As the filler becomes more tightly packed, owing to increased concentration, the particles are not able to move as freely as they can when a thinner mix is used. Hence, there is less orientation. Fewer particles form bridges between the two conductors which are being joined, which results in decreased current flow. However, as the concentration becomes less, there are fewer particles which are available for orientation. Therefore, in this case, also, there are available less bridges for current to flow; and resistivity of the bond increases.

The diameter size also plays a role. Even though the particles are of the same length, the 0.009" wires are heavier. Hence, they are not so readily moved by the magnetic force. It may be for this reason that in Mix III of this example, wherein 0.003" diameter wire is used, there is obtained substantially the same resistivity at the 10% concentration as is obtained with the 30% concenration used in Mix III of Example 1 wherein the 0.009" wire was used, i.e., 0.165 ohm-cm. for 10% of the 0.003" wire and 0.125 ohm-cm. for 30% of the 0.009" wire. A fine wire is more readily oriented than is a heavy one. Hence, less of the fine wire need be employed to obtain substantially the same decrease in resistivity.

*Example 3*

The following fillers were employed in this example:

(A) Silver wire having a diameter of 0.014" which had been cut to ca 1/16"–1/8" lengths.
(B) Iron wire having a diameter of 0.009" which had been cut to ca same lengths as in (A). Uncoated surface.
(C) Iron filings, passing 40 mesh, and gold plated with Atomex® solution as in Example 1.
(D) Beads of polystyrene (Dow foam) coated with silver.

Fillers (A), (B) and (C) were incorporated into respective mixes consisting of:

| | Parts by weight |
|---|---|
| Adiprene L–100 | 100 |
| P–400 | 6.6 |
| MOCA | 8.0 |
| Filler | 114.6 |

Adiprene L–100, P–400 and MOCA are described in Example 1. In all instances except (D), the filler content was 50% by weight of the total composition. A mix in which (D) was used was also prepared, using the same parts by weight of the other three ingredients, but employing a quantity of (D) which was only 42.3% by weight of the total weight of the total formulation, since this was about the maximum which could be incorporated.

Substantially the same amount of each mix was layered between the brass discs described in Example 1. Curing was conducted at 60° C. for 18 hours. A magnetic field of 4000 gauss was used only with those formulations which contained iron. The following electrical resistivities were obtained on the cured assemblies:

| Filler | Resistivity, ohm-cm., of pieces cured in— | |
|---|---|---|
| | Magnetic field | No magnetic field |
| Silver wire (A) | | ∞ |
| Iron wire (B) | 0.44 | |
| Au coated-iron filings (C) | 0.181 | 29.3 |
| Ag coated beads (D) | | ∞ |

Since neither the silver wire nor the silver-coated polystyrene beads are magnetizable, curing of formulations containing these fillers was not conducted in a magnetic field. With both of these formulations there was no current flow through the cured pieces, i.e., electrical resistivity was infinite. Although use of gold plated iron filings (C) gave decreased resistivity as compared to the silver fillers even when no magnetic field was used, the resistivity is still high, i.e., 29.3 ohm-cm. The decrease to 0.181 ohm-cm. which results with (C) when curing in a magnetic field demonstrates the advantage to be gained by curing a magnetizable, electricity-conducting material while in a magnetic field. That the low resistivity obtained is not necessarily a function of the gold plating is evident from the fact that use of the 0.009" uncoated iron wire and curing in the magnetic field also gave a low resistivity value, i.e., 0.44 cm. However, combination of the magnetic field and the noble metal coating gave the lowest value.

In all of the above examples, iron has been employed as the magnetizable component and gold as the surface coating, in order to present comparative data. However, as will be evident to those skilled in the art, other magnetizable metals, e.g., cobalt, nickel or gadolinium are similarly useful, either uncoated or coated with a noble metal. Also, although the same organic adhesive was used, other adhesives may be used instead, e.g., the epoxy adhesives, the synthetic rubber adhesives, etc. The coated or uncoated fillers may be incorporated into a mobile mix which hardens without application of heat, or the mix may be hardened by heating. As will be realized by those skilled in the art, the magnitude of applied magnetic force may be widely varied from that used above, depending upon the kind and quantity of the magnetizable material, the temperature at which the hardening is conducted, and the mobility of the organic matrix.

Particularly significant is the fact that the present invention provides a means of building conducting pathways by orienting magnetic particles so as to form a chain or bridge. This is effected regardless of the length of the particle and of the ratio between said length and the thickness of the adhesive layer. Very thick adhesive layers having unidirectional conductivity can thus be made. Moreover, although this invention is particularly concerned with electricity conducting adhesives since the problem of joining two conductors without diminishing conductivity is paramount, the invention also provides a means of making conducting castings or moldings of any dimension. Objects of any size or shape having unidirectional electricity conducting property can obviously be made by incorporating the magnetizable, electricity conducting fillers into a mobile molding or casting mix and allowing the mix to harden in a magnetic field while shaping.

As many apparently widely different embodiments of this invention may be made without departing from the spirit and scope hereof, it is to be understood that the invention is not limited to the specific embodiments hereof except as defined in the appended claims.

What we claim is:

1. The process of bonding together electricity conducting units which comprises interposing between the units at the desired junction so as to contact a surface of each unit, a layer of a composition consisting essentially of (1) a hardenable organic adhesive in the mobile state and (2) from 5% to 60% by weight of the composition of a ferromagnetic, electricity-conducting, finely particulated filler; and maintaining one interface of the layer normal to the lines of force of an applied magnetic field while the adhesive is hardening, to form bridges of conducting particles between the opposing interfaces.

2. The process defined in claim 1, further limited in that the filler is an elongated particle having a length which is substantially equal to the thickness of said layer.

3. The process defined in claim 1, further limited in that the filler is finely particulated metal selected from the class consisting of iron, cobalt, nickel and gadolinium.

4. The process defined in claim 1, further limited in that the filler is particulated iron.

5. The process defined in claim 1, further limited in that the filler is finely particulated metal selected from the class consisting of iron, cobalt, nickel, gadolinium, and alloys thereof, coated with a noble metal.

6. The process defined in claim 1, further limited in that the filler is finely particulated iron coated with a noble metal.

7. The process defined in claim 1, further limited in that the filler is finely particulated iron coated with gold.

8. The process of bonding together electricity conducting units which comprises interposing between the units at the desired junction, to contact a surface of each unit, a layer of a composition consisting essentially of (1) a hardenable, polyurethane-forming mix and (2) from 10% to 50% by weight of the composition of a ferromagnetic, electricity conducting, finely particulated filler; and maintaining one interface of the layer normal to the lines of force of an applied magnetic field while the urethane is hardening, to form bridges of conducting particles between the opposing interfaces.

9. The process defined in claim 8, further limited in that the filler is a finely particulated metal selected from the class consisting of iron, cobalt, nickel, gadolinium, and alloys thereof.

10. The process defined in claim 8, further limited in that the filler is finely particulated iron coated with a noble metal.

11. The process defined in claim 8, further limited in that the filler is finely particulated iron.

12. The process defined in claim 8, further limited in that the filler is finely particulated iron coated with gold.

References Cited

UNITED STATES PATENTS

| | | | |
|---|---|---|---|
| 2,718,506 | 10/1955 | Ellerman | 252—513 |
| 2,774,747 | 12/1956 | Wolfson et al. | 252—514 XR |
| 3,031,344 | 3/1962 | Sher et al. | 117—212 |
| 3,056,750 | 10/1962 | Pass | 252—511 |

FOREIGN PATENTS

| | | |
|---|---|---|
| 519,298 | 3/1940 | Great Britain. |

OTHER REFERENCES

Delmonte, Metal Filled Plastics Reinhold (1961) p. 175.

LEON D. ROSDOL, *Primary Examiner.*

J. D. WELSH, *Assistant Examiner.*